United States Patent

Deakin et al.

Patent Number: 5,741,604
Date of Patent: Apr. 21, 1998

[54] DIFFUSION BARRIER LAYERS

[75] Inventors: Martin J. Deakin, Olney; John R. Nicholls, Great Horwood, both of Great Britain

[73] Assignee: The Secretary of State for Defence in her Britannic Majesty's Government of the United Kingdom of Great Britain & Northern Ireland of Defence & Evaluation Research Agency,DRA, United Kingdom

[21] Appl. No.: 505,198

[22] PCT Filed: Feb. 15, 1994

[86] PCT No.: PCT/GB94/00301

§ 371 Date: Oct. 25, 1995

§ 102(e) Date: Oct. 25, 1995

[87] PCT Pub. No.: WO94/18359

PCT Pub. Date: Aug. 18, 1994

[30] Foreign Application Priority Data

Feb. 15, 1993 [GB] United Kingdom ............... 9302978

[51] Int. Cl.[6] ............................................. B32B 15/01
[52] U.S. Cl. ........................ 428/660; 428/670; 428/680; 148/525; 148/527; 427/383.7
[58] Field of Search ................................. 148/512, 525, 148/527; 427/376.8, 383.7; 428/660, 670, 678, 680; 420/466

[56] References Cited

U.S. PATENT DOCUMENTS

| | | | |
|---|---|---|---|
| 3,979,273 | 9/1976 | Panzera et al. | 428/670 |
| 4,198,442 | 4/1980 | Gupta et al. | 427/376.8 |
| 4,284,688 | 8/1981 | Stücheli et al. | 428/678 |
| 4,305,998 | 12/1981 | Manty et al. | 428/660 |
| 5,198,043 | 3/1993 | Johnson | 148/512 |
| 5,270,081 | 12/1993 | Manier et al. | 427/376.8 |
| 5,500,252 | 3/1996 | Meelu | 427/376.8 |
| 5,562,999 | 10/1996 | Grunke et al. | 148/525 |
| 5,580,668 | 12/1996 | Kellam | 428/670 |

*Primary Examiner*—George Wyszomierski
*Attorney, Agent, or Firm*—Nixon & Vanderhye

[57] ABSTRACT

A method of applying a stable intermetallic diffusion barrier layer to a metallic article is described. In many instances, protective coatings are incompatible with the material of the substrate to which they are applied. Such incompatibility is overcome in the invention through in situ formation of an intermediate stable diffusion barrier layer by sequential deposition and subsequent reaction of suitable metals to form a continuous intermetallic layer. A conventional overlay coating may then be applied to the intermetallic layer without risk to the underlying substrate. The invention also contemplates creation of unitary diffusion barriers from multi-layer deposits; deposition of plural diffusion barriers, and formation of complete protective systems comprising substrate, diffusion barrier(s) and overlay coating prior to heat treatment in situ.

11 Claims, 1 Drawing Sheet

$t_A$ = THICKNESS OF LAYER "A"
$t_B$ = THICKNESS OF LAYER "B"

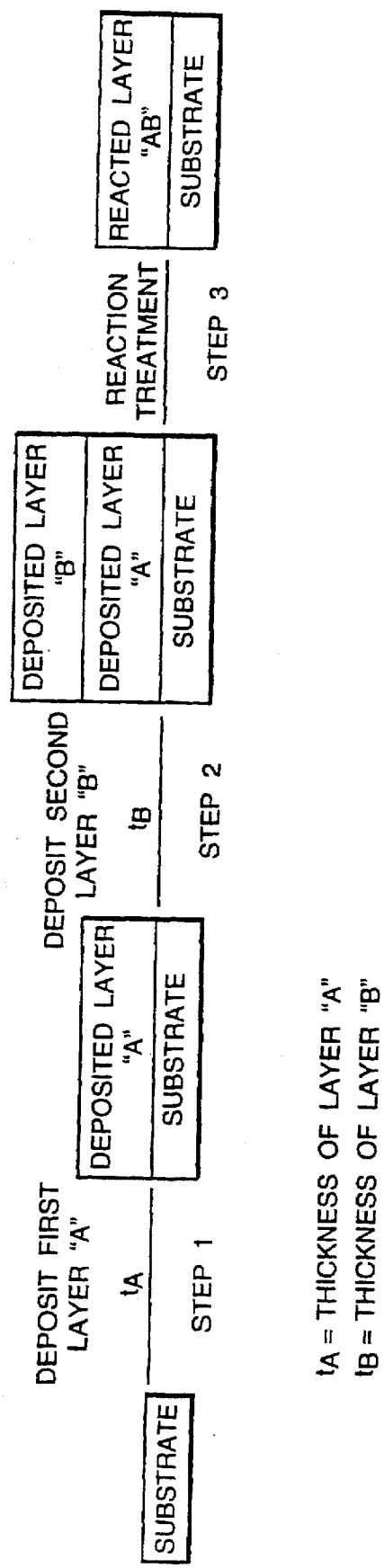

DIFFUSION BARRIER LAYERS

This application is a 35 U.S.C. § 371 national phase application of PCT/GB94/00301, filed Feb. 15, 1994.

The present invention relates to protective coatings for metallic articles, and in particular to stable diffusion barrier coatings which can be applied to inhibit the deterioration of substrate materials as a result of interaction with external stimuli.

BACKGROUND OF THE INVENTION

The utility of many materials is limited by their tolerance of operating conditions since, in hostile environments such as extended exposure to high temperatures and temperature cycling of the type found in gas turbine engines, environmental degradation can be very severe.

Over the years, technology has developed a variety of protective e coatings to extend the operating lifetime and/or the maximum permitted working temperature of many materials. However, the coatings of choice for particular applications, for example coatings having good oxidation or corrosion resistance, are not necessarily compatible with the substrate material to which they are applied. In many cases there are unfavourable interactions between the material of the substrate and the coating composition, with the result that the physical and mechanical properties of the substrate are compromised. Deterioration of metallic materials is accelerated at elevated operating temperatures.

Formation of intermetallic protection layers of high temperature components is known in JP 570155364, where a $PtAl_2$ discontinuous intermetallic phase of approximately 35–50 μm is formed by a diffusion pack aluminising process at a temperature of 1150° C. High temperature materials are defined as those materials capable of operating at temperatures of 500° C. or greater. This protection layer does not afford uniform protection for the substrate material.

There is therefore a need for a uniform coating technique for high temperature components which will allow the best possible coatings for a given purpose to be applied to a particular substrate regardless of the interactions which might otherwise occur between the two.

BRIEF DESCRIPTION OF THE DRAWING

FIG. 1 is a schematic illustration of the sequence of steps necessary to carry out the invention.

DESCRIPTION OF THE INVENTION

According to the present invention, this is achieved by applying a stable continuous uniform diffusion barrier as an intermediate coating between the protective coating and the surface of the high temperature substrate material. The diffusion barrier serves to inhibit the breakdown of the protective coating system by minimising coating/substrate interactions, such that efficacy of the protective coating is maintained even though the composition of the coating may be altered by loss through surface oxidation/corrosion. The diffusion barrier also helps to preserve the physical and mechanical properties of the substrate, by limiting unfavourable interactions.

In particular, the inventive technique relies on the in situ formation of a continuous stable diffusion barrier by means of sequential layering and subsequent reaction treatment of suitable metallic species to produce a diffusion barrier of intermetallic form. This inventive concept extends also to diffusion barriers consisting of multi-intermetallic layers each limiting the diffusion of a specific element (or elements), and is not necessarily limited to the formation of a single intermetallic diffusion barrier layer of homogeneous structure. By selection of appropriate intermetallic species, interdiffusion of the protective coating through the barrier can be minimised.

The invention is a method of producing a continuous stable intermetallic diffusion barrier on a metallic high temperature article, the method comprising the steps of:

depositing at least a first layer of a first metal on the surface of the article;

depositing at least a second layer of a second metal on the surface of the article to a depth sufficient to provide a predetermined molar ratio of the first and second metals, and performing a reaction treatment which causes the first and second metals to combine to form an intermetallic species.

The term metallic is used to define substrates made of metal, intermetallic or alloy materials.

For certain applications, it may be advantageous to use a number of sequential deposition steps to build up the requisite thickness of first and second metals prior to the reaction step.

As indicated above, it may sometimes be advantageous to deposit a plurality of intermetallic diffusion barriers, each of which serves as a barrier against diffusion by particular species.

It is also possible to build up a complete protective system comprising the metallic article substrate, diffusion barrier(s) and overlay coating prior to heat treatment in situ of the complete protective system. In this condition, it is important to ensure that the top-most metal of the diffusion barrier precursor has a low interaction with the overlay coating.

The reaction treatment step may be carried out prior to or during the normal alloy heat treatment cycle to which the metallic article is subject. Preferably the reaction treatment is a simple heating step which involves raising the deposited metals to a sufficiently high temperature to initiate the exothermic reaction necessary to form the intermetallic species. This may be performed under moderate vacuum to minimise depletion of the second metal layer by atmospheric oxidation.

Alternatively, the reaction treatment could be carried out at high pressure, for example using a hot isostatic pressing technique. Apart from simple heating, the reaction treatment step could also be performed by thermally exciting the first and second metal layers using a laser beam, plasma treatment, or any other high energy surface treatment.

Preferably the diffusion barrier layer formed by the method of this invention is of a thickness between 0.1 μm and 10 μm, although more preferably the barrier layer thickness is between 0.8 μm and 3.0 μm.

The invention will now be described by way of example with reference to FIG. 1 which shows in schematic form the sequence of steps necessary to carry out the invention.

Referring now to the Figure, step 1 represents the deposition of a first layer of a metal "A" upon the substrate. The thickness $t_A$ of this first layer is determined by the overall thickness required for the reacted thermal diffusion barrier coating and the stoichiometric proportion of metal "A" present within that coating.

Step 2 represents the deposition of a second metal "B" over the first layer deposited in step 1. Again, the thickness $t_B$ of this second layer is a function of the required thickness for the finished thermal diffusion barrier and the stoichiometric proportion of metal "B" present.

Step 3 represents the reaction treatment step which results in combination of the two discrete layers of metals "A" and "B" into a single diffusion barrier layer of intermetallic "AB".

Assuming the reacted diffusion barrier layer $A_xB_y$ is a stoichiometric intermetallic product, in order to obtain the desired stoichiometry it must contain proportionally x moles of metal "A" and y moles of metal "B". If the respective atomic weights (M) of the two metals are $M_A$ and $M_B$ and their densities (p) are $p_A$ and $p_B$, then the ratio of thicknesses $t_A$ and $t_B$ should be in the same ratio as:

$$\frac{x \cdot M_A}{p_A} : \frac{y \cdot M_B}{p_B}$$

This relationship assumes that thickness is directly proportional to volume. It further assumes that little or no depletion of either layer occurs due to solid/gas or solid/solid interactions. Where such depletion occurs to an appreciable degree, appropriate adjustments must be made to the relative thicknesses of the respective layer or layers.

DESCRIPTION OF THE PREFERRED EMBODIMENTS

EXAMPLE 1

The above technique has been successfully carried out on a substrate of commercially available IMI834 titanium alloy. In this case, a diffusion barrier was required to serve as an intermediate layer between the substrate and an oxidation resistant coating. The purpose of the oxidation resistant coating was to inhibit the ingress of oxygen, thereby limiting the formation of a brittle α-case layer which would otherwise severely reduce the mechanical properties of the titanium substrate.

The sequence of steps outlined above was employed to form an intermetallic $PtAl_2$ layer from the reaction of sequentially applied Pt and Al layers using an R.F. biased D.C. sputtering route.

In order to minimise potential solid/solid interactions between the substrate material and the first metal "A", particularly in view of the high diffusivity of aluminium in titanium, the relatively slow diffusing Pt layer was deposited first. This was followed by deposition of the required thickness of Al in accordance with the ratio:

$$\frac{M_{Pt}}{p_{Pt}} : 2\left[\frac{M_{Al}}{p_{Al}}\right]$$

(remembering that for $PtAl_2$, x=1 and y=2).

Depletion of the outer aluminium layer due to atmospheric oxidation was prevented by carrying out the reaction treatment in a moderate vacuum of roughly $2.0 \times 10^{-5}$ bar. The reaction treatment in this instance consisted of heating for a period of 2 hours at a temperature of 750° C. X-ray diffraction analysis of the surface of the diffusion barrier coating confirmed that the desired $PtAl_2$ crystal morphology had been obtained.

The continuous $PtAl_2$ intermetallic layer thus formed was then overlay-coated with an 80/20 Ni/Cr oxidation resistant layer. An oxidative heat treatment for 100 hours in air at 700° C. subsequently demonstrated the complete effectiveness of the $PtAl_2$ layer as a diffusion barrier for nickel. Moreover, etching of the substrate surface revealed no evidence of α-case formation, confirming the efficacy of the Ni/Cr layer as a barrier to oxidation.

Other intermaetallics formed as diffusion barriers on IMI834 substrate are TiAl and ($PtTi_3$+TiAl). Nickel based substrates have also been subjected to the method of this invention, with each of NiCr, NiCrAl, NiAl and Ni having a diffusion barrier of $PtAl_2$.

Following diffusion barrier formation on the NiCR and NiAl substrates and application of an overlay coating system, each specimen was subjected to oxidative heat treatment for 80 minutes at 1050° C. and also for 40 minutes at 1150° C. The ($PtTi_3$+TiAl) diffusion barrier on a substrate of IMI834 was subjected to an oxidative heat treatment of 700° C. for 100 hours. Each of the treatments demonstrated the efficacy of the respective diffusion barrier layers.

Titanium aluminite alloys formed the substrate for intermetallic diffusion barrier layers of $PtAl_2$ and also TiAl.

The table below summarizes typical diffusion barrier formation for particular substrate materials, with associated typical thickness of diffusion barrier layers and also the efficacy testing conditions.

| Substrate | Diff. Barrier | Thickness range (total) μm | Stable exposure conditions |
| --- | --- | --- | --- |
| IMI 834 | $PtAl_2$ | 0.7–3.2 | Up to 100 hrs at 700° C. |
| IMI 834 | TiAl | 1.9 | — |
| IMI 834 | ($PtTi_3$ + TiAl) | 3.0 | 100 hrs at 700° C. |
| $α_2$ | $PtAl_2$ | 0.6–1.8 | |
| $α_2$ | TiAl | 1.9 | |
| NiCr | $PtAl_2$ | 1.8–4.0 | 80 mins/1050° C. & 40 mins/1150° C. |
| NiCrAl | $PtAl_2$ | 1.8–4.0 | |
| NiAl | $PtAl_2$ | 1.8–4.0 | 80 mins/1050° C. & 40 mins/1150° C. |
| Ni | $PtAl_2$ | 1.8–4.0 | |

From the examples it can be seen that a number of diffusion barrier intermetallics can be used for differing substrates. It will be understood that alternative oxidation resistant overlay coatings could have been used. It will also be appreciated that suitable overlay coatings need not be confined to those imparting oxidation resistance.

We claim:

1. A method of producing a metallic high temperature article comprising a metallic substrate, a protective coating and a continuous uniform intermetallic diffusion barrier layer positioned between said substrate and said protective coating, said diffusion barrier layer comprising a first metal, A, said first metal having a molecular weight $M_A$ and density $p_A$ and a second metal, B, said second metal having a molecular weight $M_b$ and density $p_b$, in proportion x moles A to y moles B, the method comprising the steps of:

(a) depositing at least a first layer of said first metal on the surface of the metallic substrate, said first layer being of thickness $t_A$;

(b) depositing at least a second layer of said second metal on the surface of said first metal, said second layer being of a thickness $t_B$, the ratio of said thickness $t_A:t_B$ being substantially equal to the ratio:

$$\frac{xM_A}{p_A} : \frac{yM_B}{p_B}$$

(c) reaction treating to a sufficiently high temperature to initiate an exothermic reaction thereby causing said first and second metals to combine to form a stable, continuous uniform intermetallic diffusion barrier layer formed of an intermetallic species; and (d) depositing said protective coating on the surface of said intermetallic diffusion barrier layer.

2. A method as claimed in claim 1 wherein a plurality of sequential deposition steps is employed to build up the thickness $t_A$ and $t_B$ of said first and second metals prior to said reaction treatment.

3. A method as claimed in claim 1 wherein said steps (a), (b), and (c) are repeated thereby depositing a plurality of sequential intermetallic diffusion barrier layers of differing compositions to serve as barriers against diffusion by a variety of species.

4. A method as claimed in claim 1 wherein said reaction treatment comprises heating said deposited layers of first and second metals to a temperature sufficient to effect exothermic reaction between said first and second metals.

5. A method as claimed in claim 1 wherein the reaction treatment comprises thermal excitation of said deposited layers of first and second metals by a high energy surface treatment.

6. A method as claimed in claim 5 wherein said high energy surface treatment utilizes a laser beam.

7. A method as claimed in claim 5 wherein said high energy surface treatment is a plasma treatment.

8. A method as claimed in claim 1 further comprising applying an overlay coating to the outermost layer of the intermetallic diffusion barrier or barriers prior to said reaction treatment step to form part of a complete protection system comprising the metallic article substrate, intermetallic diffusion barrier layer or layers and overlay coating, and said reaction treatment comprises reaction treating said complete protection system in situ.

9. A method as claimed in claim 1 wherein said reaction treatment step is carried out at non-ambient pressure.

10. A metallic high temperature article comprising a metallic substrate, a protective coating and a continuous uniform intermetallic diffusion barrier layer positioned between said substrate and said protective coating, said diffusion barrier layer comprising a first metal, A, said first metal having a molecular weight $M_A$ and density $p_A$ and a second metal, B, said second metal having a molecular weight $M_B$ and density $p_B$ in proportion x moles A to y moles B produced by the method of claim 1 and the total thickness of the diffusion barrier layer is between 0.1 μm and 10 μm.

11. A metallic high temperature article as claimed in claim 10 wherein the total thickness of said intermetallic diffusion barrier layer or layers is between 0.8 μm and 3.0 μm.

* * * * *